US007358508B2

(12) United States Patent
Ring et al.

(10) Patent No.: US 7,358,508 B2
(45) Date of Patent: Apr. 15, 2008

(54) ION IMPLANTER WITH CONTAMINANT COLLECTING SURFACE

(75) Inventors: Philip J. Ring, Beverly, MA (US); Michael Graf, Belmont, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 260 days.

(21) Appl. No.: 11/272,529

(22) Filed: Nov. 10, 2005

(65) Prior Publication Data

US 2007/0102652 A1 May 10, 2007

(51) Int. Cl.
*G21K 5/00* (2006.01)

(52) U.S. Cl. ............................ 250/492.21; 250/492.2; 250/281

(58) Field of Classification Search ............ 250/492.2, 250/281, 423 R, 282, 492.21, 492.3
See application file for complete search history.

(56) References Cited

U.S. PATENT DOCUMENTS 4,560,879 A * 12/1985 Wu et al. ................ 250/492.2
5,656,092 A 8/1997 Blake et al.
5,903,009 A * 5/1999 Bernstein et al. ...... 250/492.21
5,909,031 A * 6/1999 Kellerman et al. .... 250/492.21
7,019,314 B1 * 3/2006 Benveniste et al. .... 250/492.21
2002/0117637 A1 8/2002 Donaldson et al.
2007/0018093 A1 * 1/2007 Earm et al. ................. 250/288

* cited by examiner

*Primary Examiner*—Nikita Wells
*Assistant Examiner*—Johnnie L Smith, II
(74) *Attorney, Agent, or Firm*—Tarolli, Sundheim, Covell & Tummino LLP

(57) ABSTRACT

An ion implanter includes an ion source for generating an ion beam moving along a beam line and a vacuum or implantation chamber wherein a workpiece, such as a silicon wafer is positioned to intersect the ion beam for ion implantation of a surface of the workpiece by the ion beam. A liner has an interior facing surface that bounds at least a portion of the evacuated interior region and that comprises grooves spaced across the surface of the liner to capture contaminants generated within the interior region during operation of the ion implanter.

15 Claims, 3 Drawing Sheets

150 154 152 156

W 176 172 174 170 D

O 160
162
164

W
176
172
174
170
D

ION IMPLANTER WITH CONTAMINANT COLLECTING SURFACE

FIELD OF THE INVENTION

The present invention concerns systems for ion implantation of semiconductor wafers and other workpieces and, more particularly, a means of reducing the effects of contaminants in the beam line.

BACKGROUND ART

Axcelis Technologies, assignee of the present invention, designs and sells products for treatment of workpieces such as silicon wafers during integrated circuit fabrication. Ion implanters create an ion beam that modifies the physical properties of workpieces such as silicon wafers that are placed into the ion beam. This process can be used, for example, to dope the silicon from which the untreated wafer is made to change the properties of the semiconductor material. Controlled use of masking with resist materials prior to ion implantation as well as layering of different dopant patterns within the wafer produce an integrated circuit for use in one of a many applications.

Ion implanters typically include an ion source for producing a plasma from gaseous feed material or from vapor from a solid or liquid feed material. An ion beam is extracted from the source plasma by creating an electric field between the source plasma and another electrode.

After exiting the source the ion beam traverses a region through which the beam is shaped and accelerated to a desired energy before the beam enters an implantation chamber where the ions of the beam impact one or more wafer workpieces. Operation of an ion implanter results in the production of certain contaminant particles. One source of contaminant particles is undesirable species of ions generated in the ion source. Contaminant particles with respect to a given implant result from the presence of residual ions from a previous implant in which different ions were implanted. For example, after implanting boron ions in a given number of wafers, it may be desired to change over the implanter to implant arsenic ions. It is likely that some residual boron atoms remain in the interior region of the implanter.

Yet another source of contaminant particles is photoresist material. Photoresist material is coated on wafer surfaces prior to implantation and is required to define circuitry on the completed integrated circuit. As ions strike the wafer surface, particles of photoresist coating are dislodged from the wafer.

Contaminant particles which collide with and adhere to wafers during ion treatment are a major source of yield loss in the fabrication of semiconductor and other devices which require submicroscopic pattern definition on the treated wafers.

U.S. Pat. No. 5,656,092 to Blake et al concerns a method of capturing and removing contaminant particles moving within an evacuated interior region of an ion beam implanter is disclosed. A particle collector has a surface to which contaminant particles readily adhere. The particle collector is secured to the implanter such that particle adhering surface is in fluid communication to the contaminant particles moving within the interior region. At periodic intervals the particle collector is removed from the implanter.

SUMMARY OF THE INVENTION

An ion implanter is disclosed that includes an ion source for generating an ion beam that is confined to a beam path and an implantation chamber having an evacuated interior region wherein a workpiece is positioned to intersect the ion beam. Beam confining structure allows ions exiting the source to accelerates to the implantation chamber. A particle trap having an exposed surface having grooves or channels extending into the surface that are spaced across at least a portion of the exposed surface.

In one exemplary embodiment the implanter has a liner having an interior facing surface that bounds at least a portion of the evacuated interior region of the implanter and has grooves spaced across the surface of the liner to capture contaminants generated within the interior region during operation of the ion implanter.

These and other features of the exemplary embodiment of the invention are described in detail in conjunction with the accompanying drawings.

EXEMPLARY MODE FOR PRACTICING THE INVENTION

Figure 1:
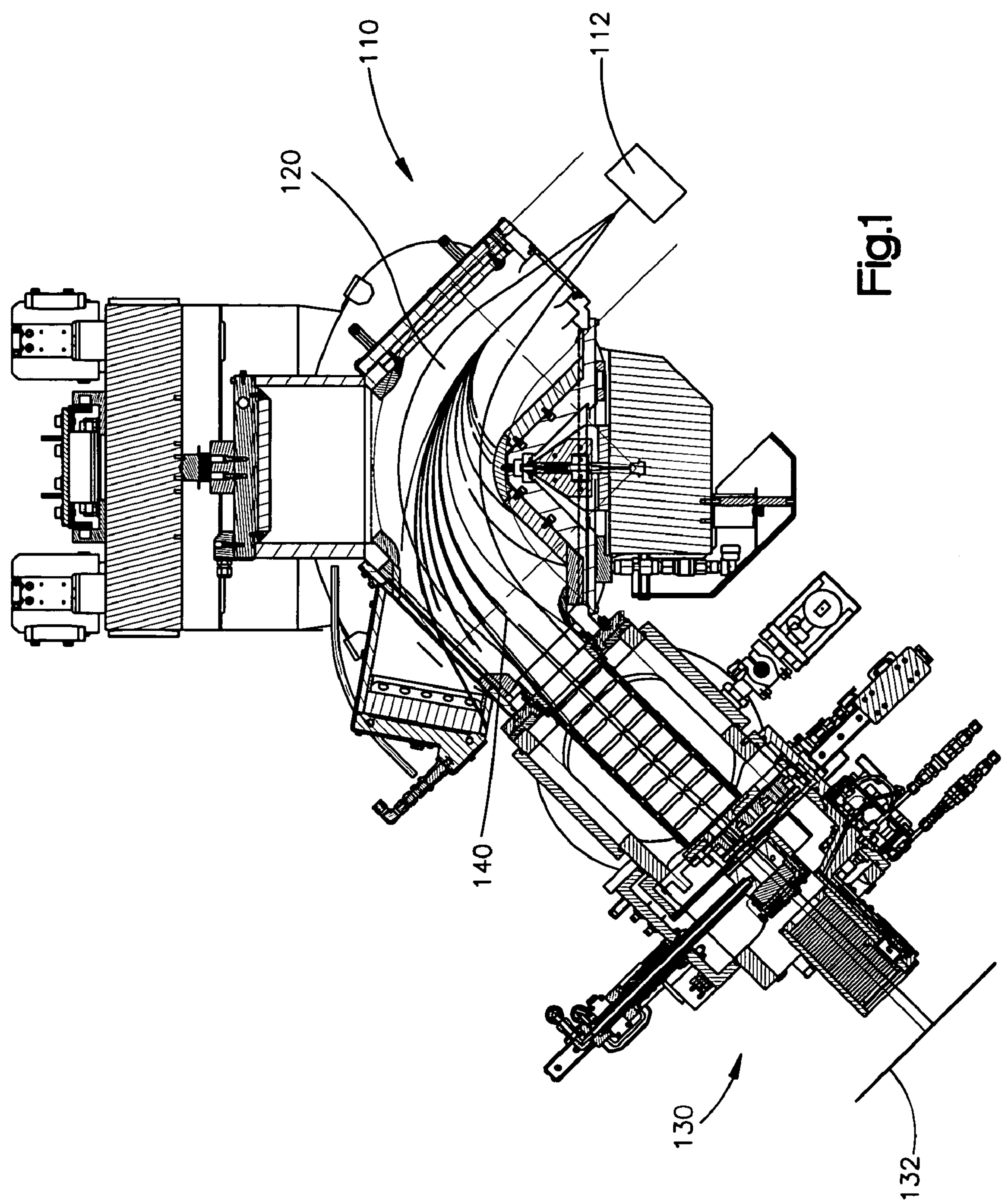
FIG. 1 is a top sectional view of an ion beam implanter illustrating an ion beam path from a source to a workpiece support.
Figure 2:
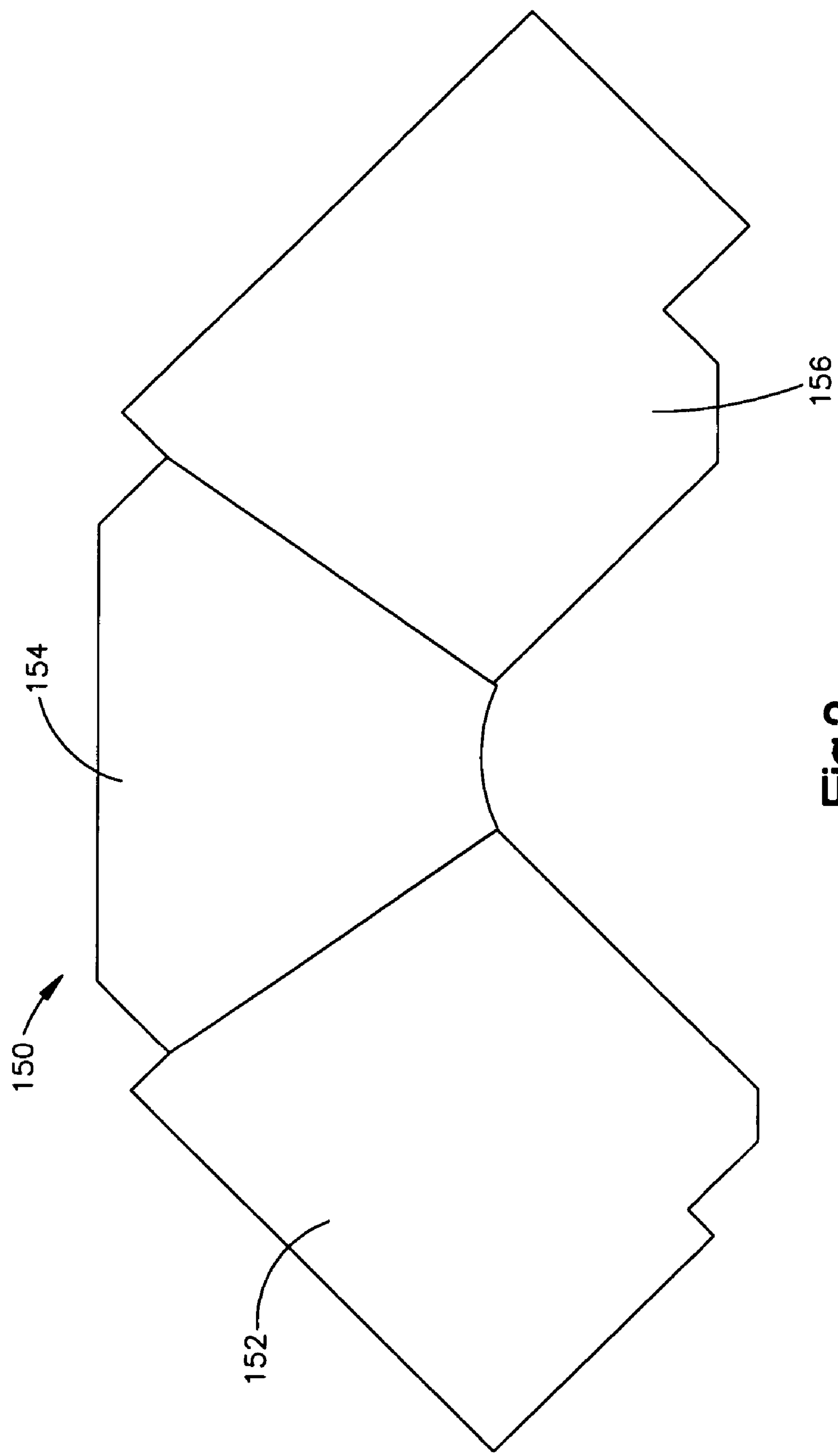
FIG. 2 is a plan view of a liner for use with the FIG. 2 implanter.

Turning to the drawings, FIG. 1 illustrates a schematic depiction of an ion implanter 110. The implanter includes an ion source 112 for creating ions that form an ion beam which is shaped and selectively deflected to traverse a beam path 140 to an end or implantation station 130. The implantation station includes a vacuum or implantation chamber defining an interior region in which a workpiece such as a semiconductor wafer is positioned by a support 132 for implantation by ions that make up an ion beam originating at the source 112. Control electronics are provided for monitoring and controlling the ion dosage received by the workpiece. Operator input to the control electronics are performed via a user control console located near the implantation station 130. The ions in the ion beam tend to diverge as the beam traverses a region between the source and the implantation chamber. To reduce this divergence, the region is maintained at low pressure by one or more vacuum pumps.

The ion source 112 includes a plasma chamber defining an interior region into which source materials are injected. The source materials may include an ionizable gas or vaporized source material. Ions generated within the plasma chamber are extracted from the chamber by an ion beam extraction assembly which includes a number of electrodes for creating an ion accelerating electric field.

Downstream from the beam extraction assembly, a mass analysis magnet 120 bends ions of the proper charge to mass ratio along trajectories so that only a desired ion species of a beam 140 enter the ion implantation chamber 130.

The magnet 120 is an electro magnet having a core, including yoke and pole pieces constructed from a ferromagnetic material. A magnetic field is induced in the pole gap of the magnet through controlled electrical energization of current carrying conductors that bound a region through which the ions emitted from the source move. The current flowing in the coils induces a magnetic field with direction perpendicular to the path of the beam to deflect the ions away from their initial trajectory. The pole pieces help to shape the magnetic field in the pole gap to high uniformity, and the magnetic flux induced through the pole gap returns through the magnet yokes on either side of the pole gaps.

Only the proper species ion for ion implantation is intended to exit the magnet along an exit trajectory that for impingement on a workpiece. Other ion species, however, are created by the ion source 112 and these ions impact structure bounding the ion beam path 114 due to their deflection by the magnet through lesser or greater deflection amounts than the intended implantation ions. These collisions are one source of ion implanter contamination. Another source of ion contamination is photoresist at the ion implantation chamber which becomes dislodged from the workpiece and collects on exposed surfaces of the ion implantation chamber 130. For illustration purposes the use of a liner 150 is discussed in relation to the region of the magnet 120 but for purposes of construing the accompanying claims it is clear that the invention has applicability in any evacuated region of the implanter 110 prone to contaminant build up.

Figure 3:
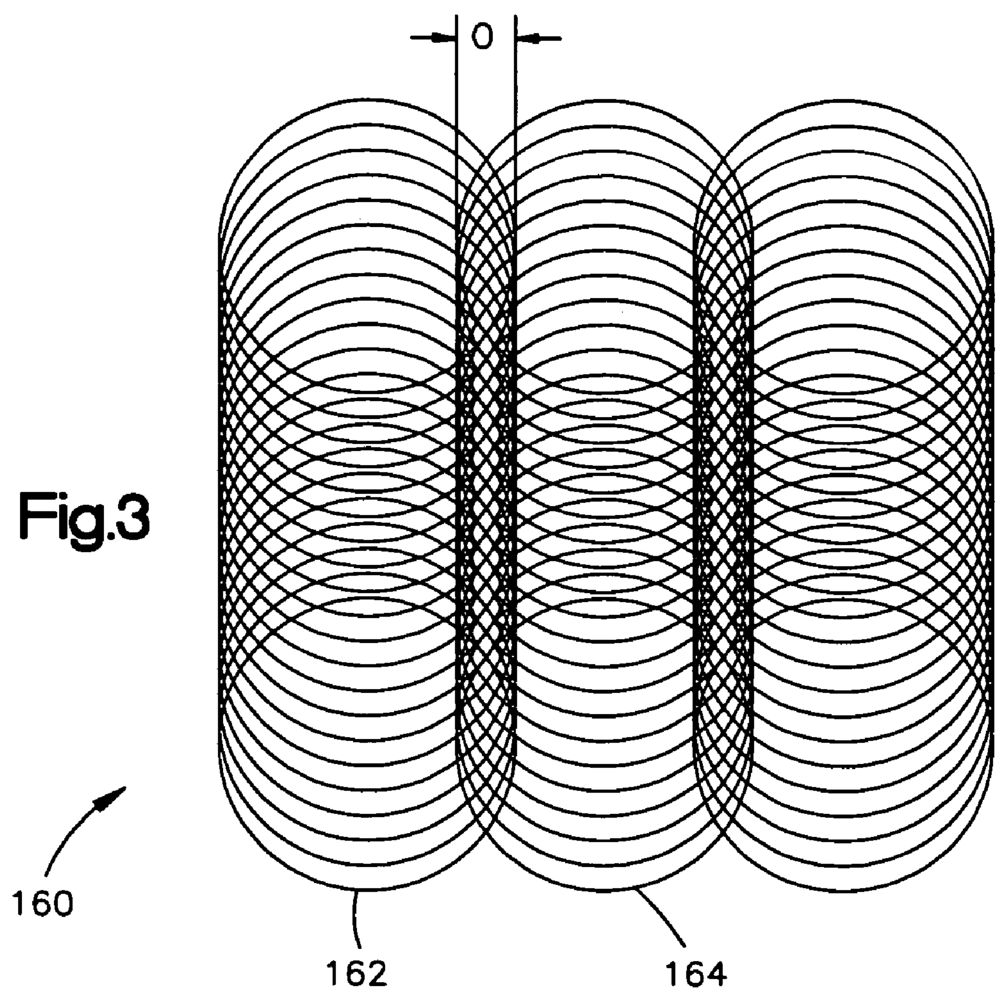
FIG. 3 is a schematic depiction of a pattern of grooves formed in the liner for trapping impurities as they accumulate within the ion implanter.

FIG. 3 illustrates a graphite liner 150 having three liner panels 152, 154, 156. The liner 150 bounds an interior region of the magnet 120, i.e. the panels are dimensioned and arranged such that they fit into the magnet gap and bound the ion beam path along the length of the arcuate beam path 140 through the magnet. Two liners (above and below the beam line) are used in accordance with one embodiment of the invention. The liners can be removed and are reversible since both the top and the bottom surfaces of each liner panel are textured with grooves. The top liners become the bottom liners and the bottom liners become the top liners. Once they have been used in both positions (top and bottom) they are removed from the implanter and replace with new liners. While liners are disclosed that are specifically adapted for use in the region of the magnet 120, the liners can be used on any surface experiencing ion beam collisions including but not limited to extraction electrodes, beam guide apertures, dumps, resolving apertures and acceleration/deceleration electrodes, and process chambers and the like.

The texture of a surface on which sputtered contaminant material adheres has an effect on how much of a deposit forms and how stable, i.e. resistant to flaking the deposit is. In accordance with the invention the three panels 152, 154, 156 are constructed of graphite and channels are grooved into the outer (exposed) surface of these panels. Both the height and depth and width of the channels or grooves are important.

There are three pieces on top and three pieces on the bottom to form a liner 150 of the beamguide. The roughening of the surface is achieved with a single point cutter having a maximum diameter of 0.2 mm. The tip is driven in a generally circular pattern having a diameter of 31.75 mm. The speed of revolution about this diameter is 500 revolutions per minute and the cutter is made to traverse a linear back and forth path at a rate of 250 mm/minute. As seen in the depiction of FIG. 3 illustrating a pattern 160 of these movements. After one traversal of the linear path 162 the cutter is moved to the side and moved along a generally parallel path 164 to the first such that the circular grooves or channels overlap O a minimum overlap distance of at least 0.50 mm. This is but one of many suitable ways to perform the roughing of the liner surface.

Figure 4:
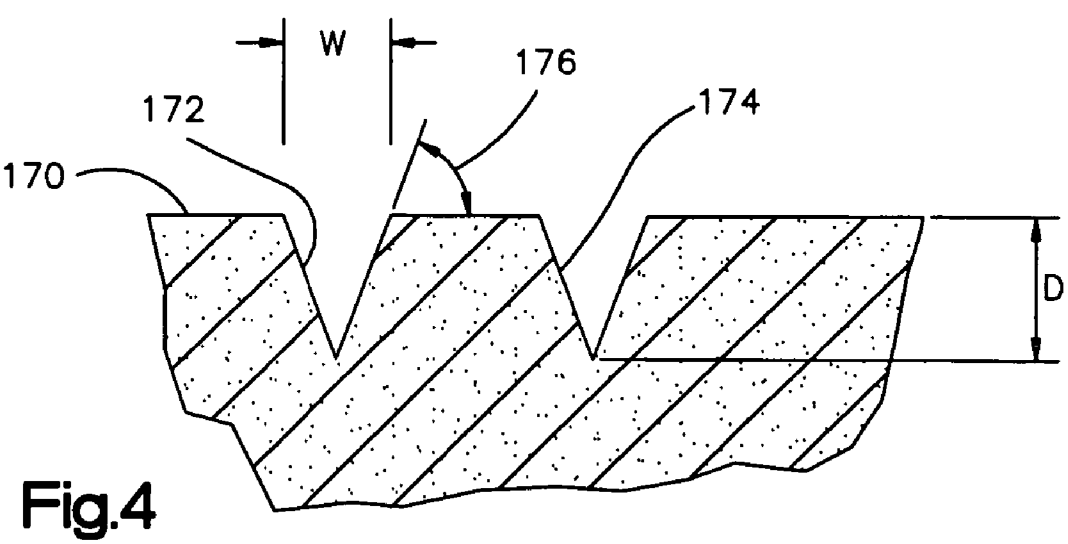
FIG. 4 is an enlarged sectional depiction of a portion of the liner having channels machined to trap particle impurities.

FIG. 4 illustrates two adjacent grooves or channels 172, 174 of a generally planar surface 170 of the graphite liner 170. The width W and depth D was varied through a variety of different ranges. An exemplary ion implanter has grooves in the panels having a width in a range between 0.00254 and 1.2 mm. The exemplary ion implanter grooves have a depth of the grooves or channels in a range of 0.00254 to 2.5 mm. Different shape cutting tips were chosen with the preferred tip having an attack angle 176 of approximately 60 degrees. It was found that the most important criteria was to control the width W but it is emphasized that different widths were successful in achieving longer live for the liner contaminant gather implanter insert.

While the present invention has been described with a degree of particularity, it is the intent that the invention includes all modifications and alterations from the disclosed design falling with the spirit or scope of the appended claims.

We claim:

1. An ion implanter comprising:

a) an ion source for generating an ion beam confined to a beam path;

b) an implantation chamber having an evacuated interior region wherein a workpiece is positioned to intersect the ion beam;

c) beam confining structure including structure that accelerates and shapes ions from the source that form the ion beam along a beam path between the ion source and the implantation chamber; and d) a particle trap having an exposed surface having grooves or channels having a width in a range between 0.00254 and 1.2 millimeters extending into said surface that are spaced across at least a portion of the exposed surface.

2. The ion implanter of claim 1 wherein the grooves are approximately 0.2±0.01 mm wide.

3. The implanter of claim 1 wherein the grooves are v shaped.

4. The implanter of claim 1 wherein the grooves or channels are formed along arcuate paths.

5. The ion implanter of claim 1 where a depth of the grooves or channels into said surface is in range of 0.00254 to 2.5 millimeters.

6. The ion implanter of claim 5 wherein the grooves have a depth of 1 ±0.01 mm.

7. The implanter of claim 1 wherein the particle trap comprises a graphite material.

8. An ion implanter method comprising:

a) creating ions in a confined region;

b) accelerating ions away from the confined region through an evacuated region to form a beam and shaping the ion beam so that ions within the beam follow a desired beam path;

c) positioning a workpiece within an ion implantation chamber in fluid communication with the evacuated region for ion treatment due to the ions of said beam striking the workpiece; and d) collecting contaminants by roughening an inwardly facing surface of either the evacuated region bounding the ion beam or interior walls of the implantation chamber;

e) said roughening comprising machining circular patterns into the inwardly facing surface to form grooves across an exposed surface of said inwardly facing surface.

9. The method of claim 8 wherein a liner is inserted into either the evacuated region bound the ion beam or said implantation chamber.

10. The method of claim 8 wherein the machining is performed by a cutter that is simultaneously moved about a circular path and translated across said surface.

11. In an ion implanter having an ion source for generating an ions for movement along a beam path to an implantation chamber, apparatus comprising:

structure bounding an evacuated interior region from the source to the implantation chamber; and a liner having an interior facing surface that bounds at least a portion of the evacuated interior region and that comprises grooves extend along arcuate paths that intersect other arcuate shaped grooves spaced across the surface of the liner to capture contaminants generated within the interior region during operation of the ion implanter.

12. The apparatus of claim 11 wherein the liner is graphite and the grooves have a depth of at least 0.00254 mm and a width at their widest part of at least 0.00254 mm.

13. The apparatus of claim 11 wherein the grooves are v shaped in section.

14. An ion implanter method comprising:

a) creating ions in a confined region;

b) accelerating ions away from the confined region through an evacuated region to form a beam and shaping the ion beam so that ions within the beam follow a desired beam path;

c) positioning a workpiece within an ion implantation chamber in fluid communication with the evacuated region for ion treatment due to the ions of said beam striking the workpiece; and d) collecting contaminants by roughening an inwardly facing surface of either the evacuated region bounding the ion beam or interior walls of the implantation chamber;

e) said roughing comprising forming grooves having a width in a range between 0.00254 and 1.2 millimeters across an exposed surface of said inwardly facing surface.

15. An ion implanter comprising:

a) an ion source for generating an ion beam confined to a beam path;

b) an implantation chamber having an evacuated interior region wherein a workpiece is positioned to intersect the ion beam;

c) beam confining structure including structure that accelerates and shapes ions from the source that form the ion beam along a beam path between the ion source and the implantation chamber; and d) a particle trap having an exposed surface positioned within the ion implantation chamber having grooves or channels extending into said surface that are spaced across at least a portion of the exposed surface.

* * * * *